(12) United States Patent
Parker et al.

(10) Patent No.: US 11,360,130 B2
(45) Date of Patent: Jun. 14, 2022

(54) DISTRIBUTED ELECTRICAL ENERGY METER

(71) Applicant: Schneider Electric USA, Inc., Boston, MA (US)

(72) Inventors: Aaron Parker, Portland, OR (US); Piotr Przydatek, Victoria (CA); Eric Moon, Sherwood, OR (US)

(73) Assignee: Schneider Electric USA, Inc., Boston, MA (US)

( * ) Notice: Subject to any disclaimer, the term of this patent is extended or adjusted under 35 U.S.C. 154(b) by 362 days.

(21) Appl. No.: 16/447,751

(22) Filed: Jun. 20, 2019

(65) Prior Publication Data
US 2020/0400727 A1    Dec. 24, 2020

(51) Int. Cl.
*G01R 19/25* (2006.01)
*H02J 13/00* (2006.01)

(52) U.S. Cl.
CPC ...... *G01R 19/2513* (2013.01); *H02J 13/0017* (2013.01)

(58) Field of Classification Search
CPC .. G01R 19/2513; G01R 21/06; G01R 21/133; G01R 19/2509; G01R 19/2506; H02J 13/0017; H04J 3/0661
(Continued)

(56) References Cited

U.S. PATENT DOCUMENTS 3,826,951 A    7/1974 Mater et al.
3,924,160 A    12/1975 Maier et al.
(Continued)

FOREIGN PATENT DOCUMENTS

CH    681749 A5    5/1993
CN    102095938 A    6/2011
(Continued)

OTHER PUBLICATIONS

Crossley, Time Synchronization for Transmission Substations Using GPS and IEEE 1588 (Year: 2016).*
(Continued)

*Primary Examiner* — Michael P Nghiem
*Assistant Examiner* — Dacthang P Ngo
(74) *Attorney, Agent, or Firm* — Chernoff, Vilhauer, McClung & Stenzel, LLP

(57) ABSTRACT

A system for measuring electrical network parameters may include a voltage sensing node of an electrical network with a first clock and a current sensing node of the electrical network with a second clock. At least one of the voltage sensing node and the current sensing node synchronizes the first clock with the second clock. The voltage sensing node samples a voltage signal from a voltage transducer and the current sensing node samples a plurality of current signals from respective current transducers. The voltage sensing node resamples the sampled voltage signal to determine corresponding resampled voltage signals, and the current sensing node resamples each of the sampled current signals to determine corresponding resampled current signals. The voltage sensing node communicates (1) corresponding re-sampled voltage signals and (2) a voltage time stamp based on the synchronized first clock associated with the sampled voltage signal to the current sensing node through a communication link. The system calculates electrical network parameters at the current sensing node based upon the re-sampled voltage signals and the re-sampled current signals.

9 Claims, 12 Drawing Sheets

(58) Field of Classification Search
USPC .......................................................... 702/62
See application file for complete search history.

(56) References Cited

U.S. PATENT DOCUMENTS

| | | | |
|---|---|---|---|
| 4,870,532 A | 9/1989 | Beatty, Jr. et al. | |
| 4,963,820 A | 10/1990 | Medlin | |
| 5,162,725 A | 11/1992 | Hodson et al. | |
| 5,384,712 A | 1/1995 | Oravetz et al. | |
| 5,834,932 A | 11/1998 | May | |
| 5,933,004 A | 8/1999 | Jackson et al. | |
| 5,986,860 A | 11/1999 | Scott | |
| 6,009,406 A | 12/1999 | Nick | |
| 6,329,610 B1 | 12/2001 | Takubo et al. | |
| 6,377,037 B1 | 4/2002 | Burns et al. | |
| 6,937,003 B2 | 8/2005 | Bowman et al. | |
| 7,862,356 B1 | 1/2011 | O'Leary et al. | |
| 8,545,245 B2 | 10/2013 | Dozier | |
| 8,939,787 B2 | 1/2015 | Kolbe et al. | |
| 9,031,800 B2 | 5/2015 | Filippenko et al. | |
| 2001/0043062 A1 | 11/2001 | Reid | |
| 2014/0028282 A1* | 1/2014 | Perry | G01R 19/0092 324/76.11 |
| 2014/0244191 A1 | 8/2014 | Oka et al. | |
| 2016/0072270 A1 | 3/2016 | Rostron et al. | |
| 2017/0343592 A1 | 11/2017 | Zhang et al. | |
| 2018/0189203 A1 | 7/2018 | Decaux et al. | |

FOREIGN PATENT DOCUMENTS

| | | | |
|---|---|---|---|
| EP | 9760935 A1 | | 3/1997 |
| EP | 2283371 A1 | | 2/2011 |
| FR | 2745911 B1 | | 1/1999 |
| JP | H07-14252 B2 | | 2/1995 |
| SE | WO 95/33184 | * | 12/1995 |
| WO | 9533184 A1 | | 12/1995 |
| WO | 2009140777 A1 | | 11/2009 |
| WO | 2017143425 A1 | | 8/2017 |

OTHER PUBLICATIONS

Xu, Disttributed Power Quality Monitoring System Based on Ethercat (Year: 2012).*

Kingstar, 5 Real-Time, Ethernet Based Fieldbuses Compared (Year: 2016).*

* cited by examiner

DISTRIBUTED ELECTRICAL ENERGY METER

CROSS-REFERENCE TO RELATED APPLICATIONS

None.

BACKGROUND OF THE INVENTION

The present invention relates to a distributed electrical energy metering system.

The power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Flexibility has favored adoption of digital branch power monitors incorporating data processing systems that can monitor a plurality of circuits and determine a number of parameters related to electricity consumption by the individual branch circuits or groups of circuits. A branch power monitor for measuring electricity consumption by respective branch circuits comprises a plurality of voltage and current transducers that are periodically read by the monitor's data processing unit which, in a typical branch power monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch power monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow.

The provisioning of branch power monitors is especially burdensome when multiple branch power monitors are installed within a series of panels within a facility, with the necessary wiring for the current monitors and the necessary wiring for the voltage sensing, together with the wiring between the current monitors and the voltage sensing to a power monitor.

What is desired, therefore, is a power monitoring system with simplified installation that is also dynamically scalable for the particularized environment.

The foregoing and other objectives, features, and advantages of the invention will be more readily understood upon consideration of the following detailed description of the invention, taken in conjunction with the accompanying drawings.

SUMMARY OF AN EMBODIMENT OF THE INVENTION

In one embodiment, a system for measuring electrical network parameters may include a voltage sensing node of an electrical network with a first clock and a current sensing node of the electrical network with a second clock. At least one of the voltage sensing node, the current sensing node, or another node of the system synchronizes the first clock with the second clock. The voltage sensing node samples a voltage signal from a voltage transducer and the current sensing node samples a plurality of current signals from respective current transducers. The voltage sensing node resamples the sampled voltage signal to determine corresponding resampled voltage signals, and the current sensing node resamples each of the sampled current signals to determine corresponding resampled current signals. The voltage sensing node communicates (1) corresponding re-sampled voltage signals and (2) a voltage time stamp based on the synchronized first clock associated with the sampled voltage signal to the current sensing node through a communication link. The system calculates electrical network parameters at the current sensing node based upon the re-sampled voltage signals and the re-sampled current signals. By way of example, the communication link may include EtherCat, IEEE 1588, Ethernet PTP, SERCOS, Modbus IP, BACnet TCP, SNMP, IEEE 802.15.4 Zigbee, and/or IEEE 802.11 WiFi.

In a preferred embodiment, the voltage sensing node samples the voltage signal, and resamples the voltage signal in accordance with a synchronized clock. Similarly, the current sensing node samples the current signals, and resamples the current signals in accordance with the synchronized clock. In this manner, each of the analog-to-digital converters for the respective nodes may operate in an asynchronous manner with respect to one another with the resampling aligning the current sampling with the voltage sampling. This permits each of the analog-to-digital converters to operate in a more efficient manner.

In a preferred embodiment, there are a plurality of current sensing nodes, each of which determines the relevant electrical network parameters for its sensed current signals. The voltage sensing node provides its re-sampled voltage signals and voltage time stamp to each of the current sensing nodes. The current sensing node has sufficient processing capabilities to process its sensed data together with the received voltage and time stamp data to determine relevant electrical network parameters. With each current sensing node having such sufficient processing capabilities for itself, the system is readily scalable by adding additional current sensing nodes.

DETAILED DESCRIPTION OF PREFERRED EMBODIMENT

Figure 1:
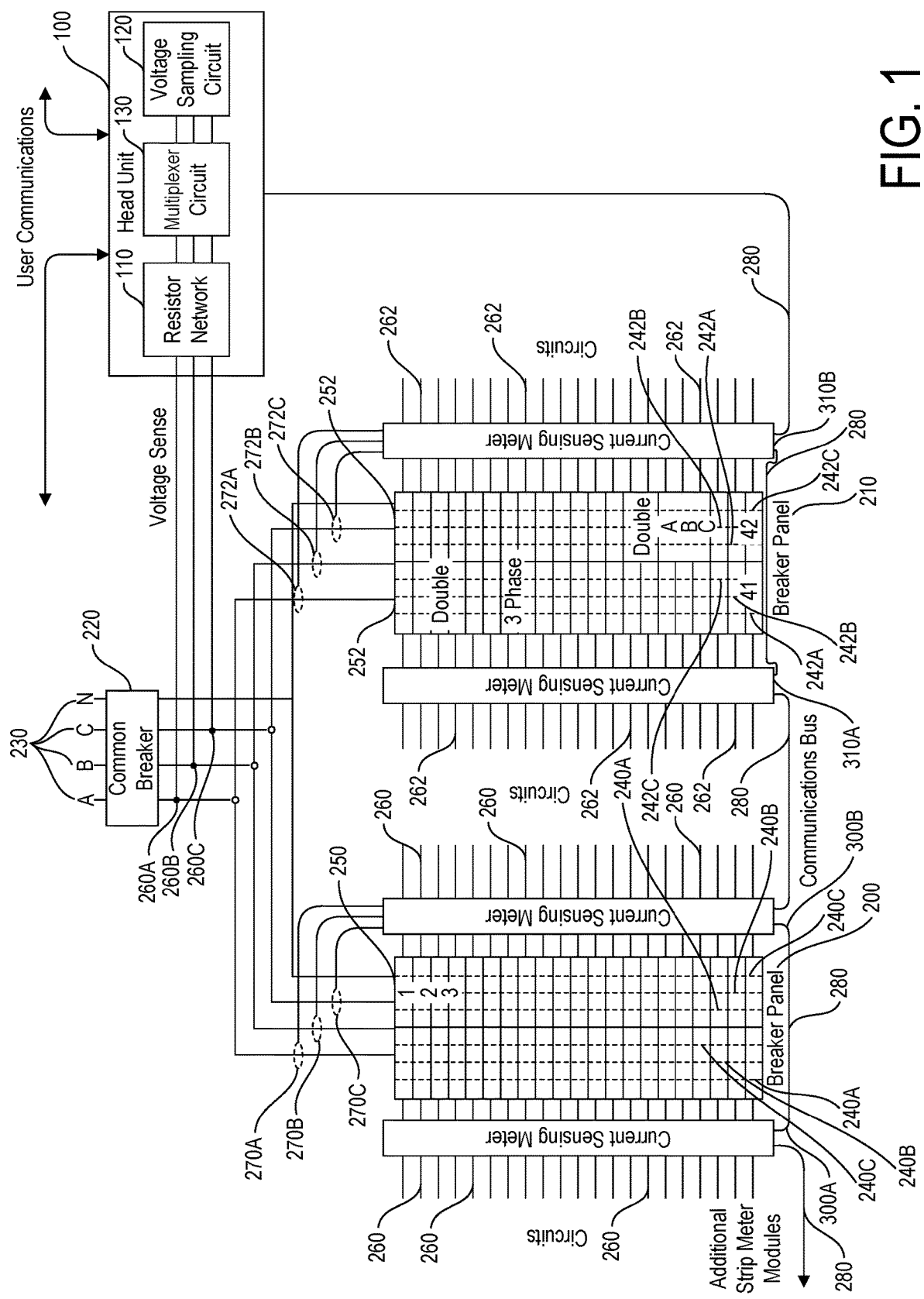
FIG. 1 illustrates a distributed power monitoring system.

Referring to FIG. 1, a distributed power monitoring system is arranged to monitor the voltage and current in a plurality of branch circuits comprises a head unit 100, one or more breaker panels 200, 210 which are often each enclosed within an enclosure, a common breaker 220, and one or more current sensing strips 300A-B, 310A-B. Typically, from a utility or other power distribution system includes one or more power conductors 230 (e.g., A, B, C) are provided to the breaker panels 200, 210. The power conductors 230 are normally part of a three phase circuit, each having a phase generally 120 degrees out of phase with the other phases, although other phase relationships may be provided. In addition, the breaker panel may include split phase or single phase three wire systems. The common breaker 220 includes one or more circuit breakers for one or more of the power conductors 230. Typically, each phase of the electricity from the power conductors 230 (phase A, phase B, phase C) are supplied to each of the breaker panels 200, 210 which are connected to respective bus bars 240A-240C, 242A-242C. A set of circuit breakers 250, 252 provide a conductive interconnection from a respective bus bar(s) 240A-240C, 242A-242C to each of the respective loads 260, 262, by way of examples, a single-phase load, a two-phase load, and/or a three-phase load. Typically, each breaker panel also includes a respective set of circuit breakers for the breaker panel. Typically, the three bus bars extend behind each of two rows of branch circuit breakers that respectively conductively connect one of the bus bars to a conductor that conducts current to the branch circuit's load(s). A single phase load is typically connected to single bus bar, a two-phase load is typically connected to two adjacent circuit breakers which are connected to respective bus bars, and a three-phase load is typically connected to three adjacent circuit breakers which are each connected to one of the three bus bars. Typically, a two-phase load or a three phase load is connected to an appropriate respective two or three phase circuit breaker with adjacent breakers.

The voltage and phase of the voltage supplied to all commonly connected loads 260, 262 is the same, therefore a meter for measuring three-phase power preferably includes three voltage transducers 260A, 260B, 260C each connected to a respective bus bar 240A-240C, 242A-242C or more preferably the respective power conductors 230 which are common to the bus bars 240A-240C, 242A-242C. The voltage transducer measures the voltage either directly or through a voltage transformer. The three voltage transducers 260A, 260B, 260C may be a voltage tap to the respective power conductor 230. The three voltage transducers 260A, 260B, 260C may include an associated resistor network 110, if desired, to lower the voltage levels. A voltage sampling circuit 120 may be used to sample the output of the voltage transducers 260A, 260B, 260C and convert the analog measurements to digital data, such as by using an analog-to-digital circuit, suitable for use by a processor. A multiplexer circuit 130 may be included that periodically temporarily connects the voltage sampling circuit 120 to selected ones of the voltage transducers 260A, 260B, 260C enabling periodic sampling of the magnitude of the voltage at each of the voltage transducers 260A, 260B, 260C. The voltage transducers 260A, 260B, 260C may be located at a location coincident with the power conductors 230, within the head unit 100, the bus bars 240A-240C, the bus bars 242A-242C, or any other suitable location(s).

Figure 2:
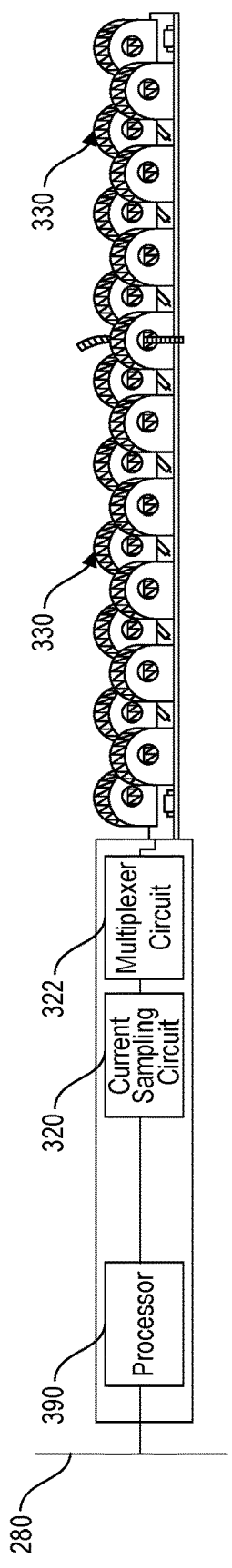
FIG. 2 illustrates a current sensing strip.
Figure 3:
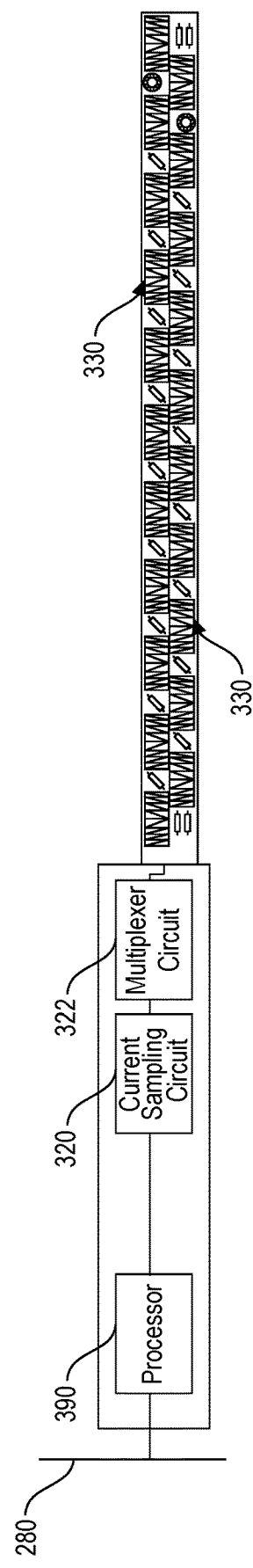
FIG. 3 illustrates another view of the current sensing strip of FIG. 2.

Referring also to FIG. 2 and FIG. 3, each of the current sensing strips 300A-B, 310A-B sense current in a plurality of branch circuits using a plurality of respective current transducers 330, each one encircling one of the branch power cable(s) that connect the power distribution panel to the load(s) of the respective branch circuit. Each of the current sensing strips may comprise a plurality of current sensors attached to a common support which readily enables replacement of selected current sensors. Also, each of the current sensors may be a solid core or a split core transformer. Preferably, the current sensor is selected based upon the wire diameter of the load and/or the ampacity of the circuit. Also, each of the current sensors may be detachably interconnected using a flexible conductor and a connector to the common support. The sensors are preferably current transformers but other types of sensors may be used. Each current transformer may comprise a coil of wire wound on the cross-section of a toroidal metallic or non-metallic core. The toroidal core is typically enclosed in a plastic housing that includes an aperture enabling a power cable to be extended through the central aperture of the core. The openings defined by the toroidal cores of the transformers are preferably oriented substantially parallel to each other and oriented substantially perpendicular to the longitudinal axis of the support. To provide a more compact arrangement of sensors, the sensors may be arranged in substantially parallel rows on the support and the housings of the sensors in adjacent rows may be arranged to partially overlap in the direction of the longitudinal axis of the support. Preferably, the center-to-center spacing of adjacent current sensors is 1 inch, ¾ inch, or 18 mm to be consistent with that of the circuit breakers in the panel and/or the wire-to-wire spacing of the loads of the breaker panel. For example, there may be 21 current sensors associated with each strip, with four such strips may include 84 current sensors. The 84 current sensors may be grouped into respective channels, each of which consisting of a single phase, a two phase, or a three phase circuit. Typically a single phase channel includes one conductor from a single one phase circuit breaker. Typically a two phase channel includes two conductors from a single two phase circuit breaker. Typically a three phase channel includes three conductors from a single three phase circuit breaker. To facilitate routing the power cables of the branch circuits through the cores of the current transformers, the common support may maintain the current transformers in a fixed spatial relationship that preferably aligns the apertures of the toroidal coils directly opposite the connections of the power cables and their respective circuit breakers when the strip is installed in a distribution panel. For protection from electrical shock, a transient voltage suppressor may be connected in parallel across the output terminals of each sensor to limit the voltage build up at the terminals when the terminals are open circuited.

Each of the current sensing strips 300A-B, 310A-B may include a current sampling circuit 320, a multiplexer 332 and the plurality of current transducers 330 communicatively connected to respective sensor positions of the current sensing strips. The multiplexer 332 sequentially connects the sampling circuit 320 to the respective sensor positions enabling the sampling circuit 320 to periodically sample the output of each of the current transducers 330. The current sampling circuit 320 may include an analog-to-digital circuit to convert the analog sample at the output of a current transducer 330 selected by the multiplexer 332, to a digital signal for acquisition by a processor 390.

Each of the panels normally includes a main panel feed with one to three phases, together with a neutral. Each of the current sensing strips 300A-B, 310A-B may include the multiplexer circuit 322, the current sampling circuit 320, and the processor 390 interconnected to a set of three current transducers 270A-270C and 272A-272C. The respective current transducers 270A-270C and 272A-272C may be located at a location coincident with the power conductors 230, within the respective current sensing strips 300B, 310B, the bus bars 240A-240C, the bus bars 242A-242C, or any other suitable location. As it may be observed, one or more of the current sensing strips 300A, 300B, 310A, 310B may omit the current transducers or otherwise the current transducers are not interconnected to a respective power conductor 230. The head unit 100 may provide power for the current sensing strips 300A-B, 310A-B through a communication bus 280. The head unit 100 and one or more current sensing strips 300A-B, 310A-B may exchange data with one another through the communication bus 280 (which may be wired and/or wireless). The processor 390 may send and receive data on the bus 280 and receive data from the current sampling circuit 320.

Each of the current circuit strips may also include an associated current sensor memory, such as included with the processor, in which are stored characterization data for the current transducers. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the processor 390 may query the current sensor memory to obtain characterization data including error correction factors and relevant specifications that are used, and apply such data to the sensed signals and/or sampled data and/or resampled data from the current sensor. By way of example, the sensed signals from the current sensor may be modified to account for phase errors.

The voltage sampling circuits 120 may also include an associated voltage sensor memory in which are stored characterization data for the voltage transducers. The characterization data may include transducer identities; relevant specifications, such as error correction factors, phase error correction factors, the type of transducers, the number of transducers, the arrangement of transducers and the order of the transducers' attachment to the respective sensor positions of the voltage circuit. At start up, the voltage sampling circuit 120 (or otherwise any suitable processor) may query the voltage sensor memory to obtain characterization data including error correction factors and relevant specifications that are used, and apply such data to the sensed signals and/or sampled data and/or resampled data from the voltage transducer. By way of example, the sensed signals from the voltage transducer may be modified to account for phase errors.

Figure 4:
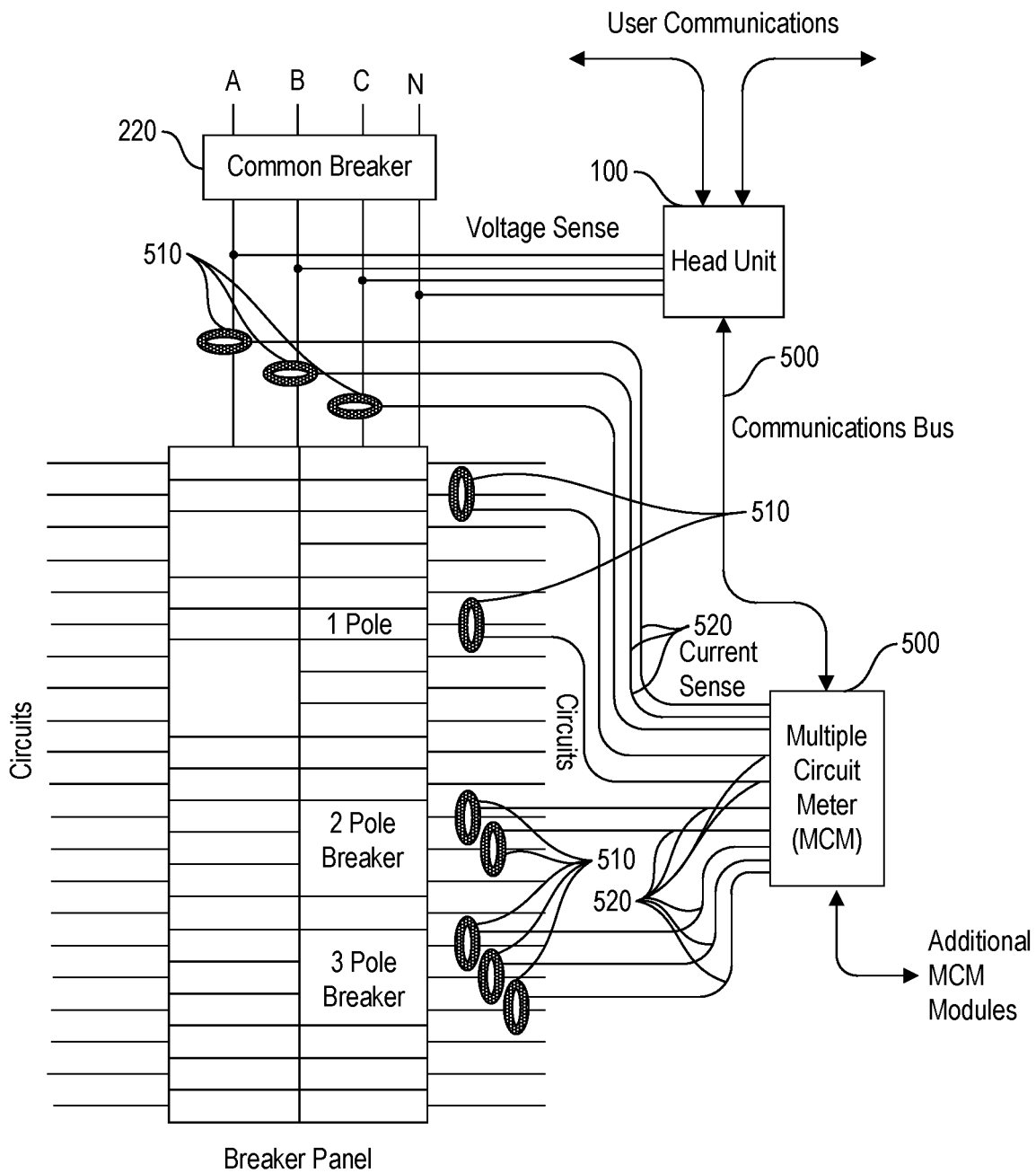
FIG. 4 illustrates another distributed power monitoring system.

Referring to FIG. 4, in another embodiment a multiple circuit meter 500 may be used instead of, or in combination with, the current sensor strip. The multiple circuit meter 500 includes a set of current transformers 510 that are interconnected to the multiple circuit meter 500 by flexible interconnections 520, such as conductive wires. The current transformers 510 may be interconnected to one or more conductors to the loads and/or to one or more conductors providing power to the breaker panel. The multiple circuit meter 500 may include a resistor network, a multiplexer, a current sampling circuit together with an analog to digital converter, and/or current sensor memory, if desired, to selectively obtain digital signals representative of the current levels in the respective conductors (e.g., see FIGS. 2 and 3). The multiple circuit meter 500 may include one or more voltage transducers together with associated circuitry, to selectively sense the voltage of the bus bars and/or power conductors associated with the breaker panel (e.g., see FIGS. 2 and 3). The multiple circuit meter 500 facilitates sensing the current levels from one or more circuits of the breaker panel that tend to be more scattered in arrangement or otherwise circuits that are not arranged in rows, such as in a breaker panel. By way of example, the multiple circuit meter 500 may be suitable for monitoring all or some of the circuits on one or more panels, or monitoring multiple circuits in industrial control panels where the breakers are not arranged with a regular spacing. While the current sensors may be solid core, the current sensors are preferably split core current sensors which are more suitable for being installed into existing installations. Further, the current sensors are preferably arranged so that the current inputs are associated with particular circuits. The head unit 100 may provide power for the multiple circuit meter 500 through a communication bus 550. The head unit 100 and one or more multiple circuit meters 500 may exchange data with one another through the communication bus 550 (which may be wired and/or wireless).

Figure 5:
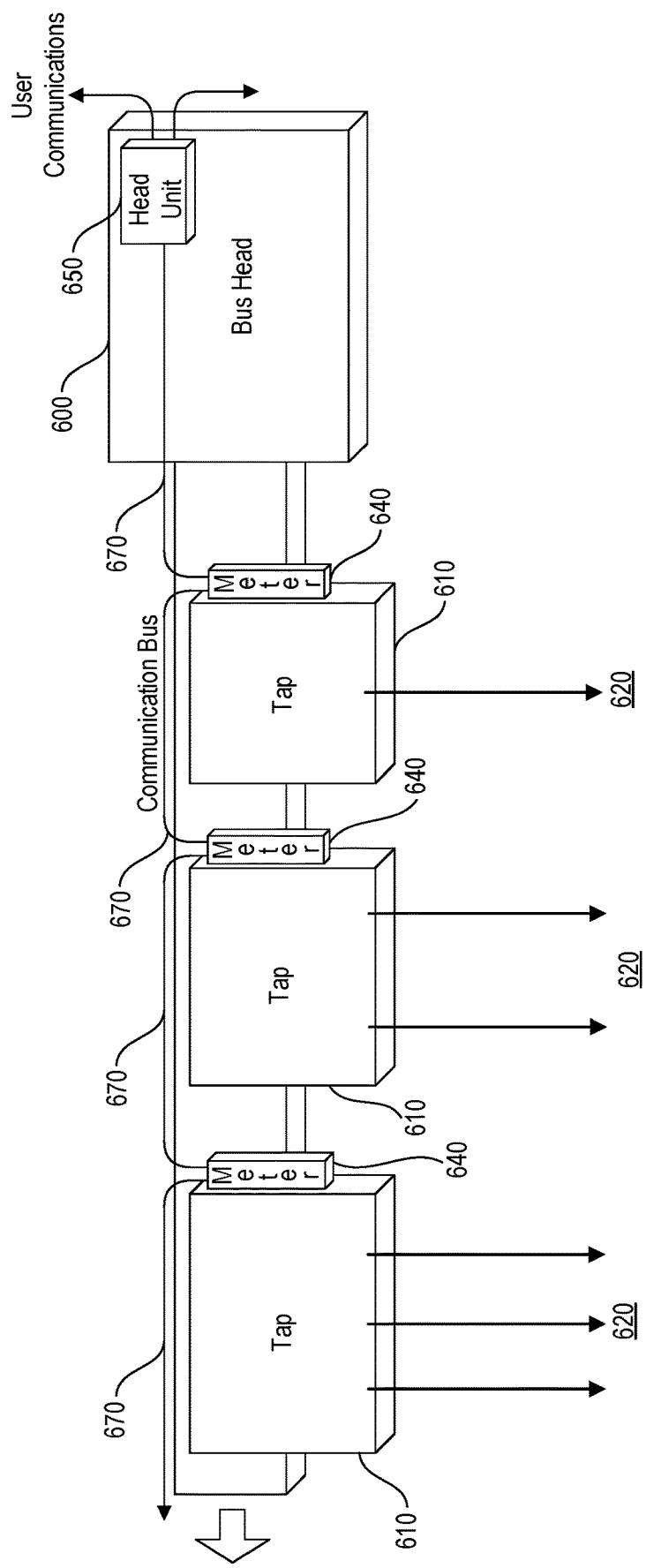
FIG. 5 illustrates another distributed power monitoring system.

Referring to FIG. 5, in another embodiment a current and/or voltage metering system may be included together with busway systems which are typically suspended from the ceilings in factories and data centers. Each busway has a head end 600 that receives power, either from another larger bus or wires. The busway typically hangs over rows of equipment. Tap boxes 610 are detachably plugged into the busway where power is needed. The tap box 610 provides one or more circuits 620 to power equipment below, each with a power cable "drop". The tap box 610 typically has a circuit breaker(s) in it to protect the drops and the equipment below. The busway head 600 and tap boxes 610 provide a location perform metering and monitor the energy consumption and status of the bus and the equipment below by interconnecting a current meter 640 associated therewith. The busway head 600 may include a head unit 650 associated therewith.

For example, the head unit 650 digitizes the voltages at the bus head 600, such as by using a voltage transducer, a voltage sense circuit, a resistor network, a multiplexer, and a voltage sampling circuit together with an analog to digital converter, such as previously described. The head unit 650 transmits a stream of voltage data together with timing information to the slave nodes (tap meters 640) downstream of it, or otherwise interconnected via a network connection (wired and/or wireless). The head unit 650 may also measure the current at the bus head 600, such as by using a current transducer, current sense circuit, a resistor network, a multiplexer, and a current sampling circuit together with an analog to digital converter, such as previously described. The head unit 650, using a processor, may calculate the energy used for the entire busway based upon the current samples and voltage samples. The bus head 600 and/or head unit 650 is also a convenient place to provide a user interface and communications channel to export the meter data. The head unit 650 may provide power for the slave nodes (tap meters) 640 through the communication bus 670. The head unit 650 and one or more meters 640 may exchange data with one another through a communication bus 670 (which may be wired and/or wireless). The slave nodes (tap meters 640) digitize the currents on one or more circuit(s) in the tap box 610. The circuits may have one or more phases. The energy usage may be calculated at each slave node 440 using a processor based upon the sampled currents scanned at the respective slave node 640 and the sampled voltages provided by the head unit.

Figure 6:
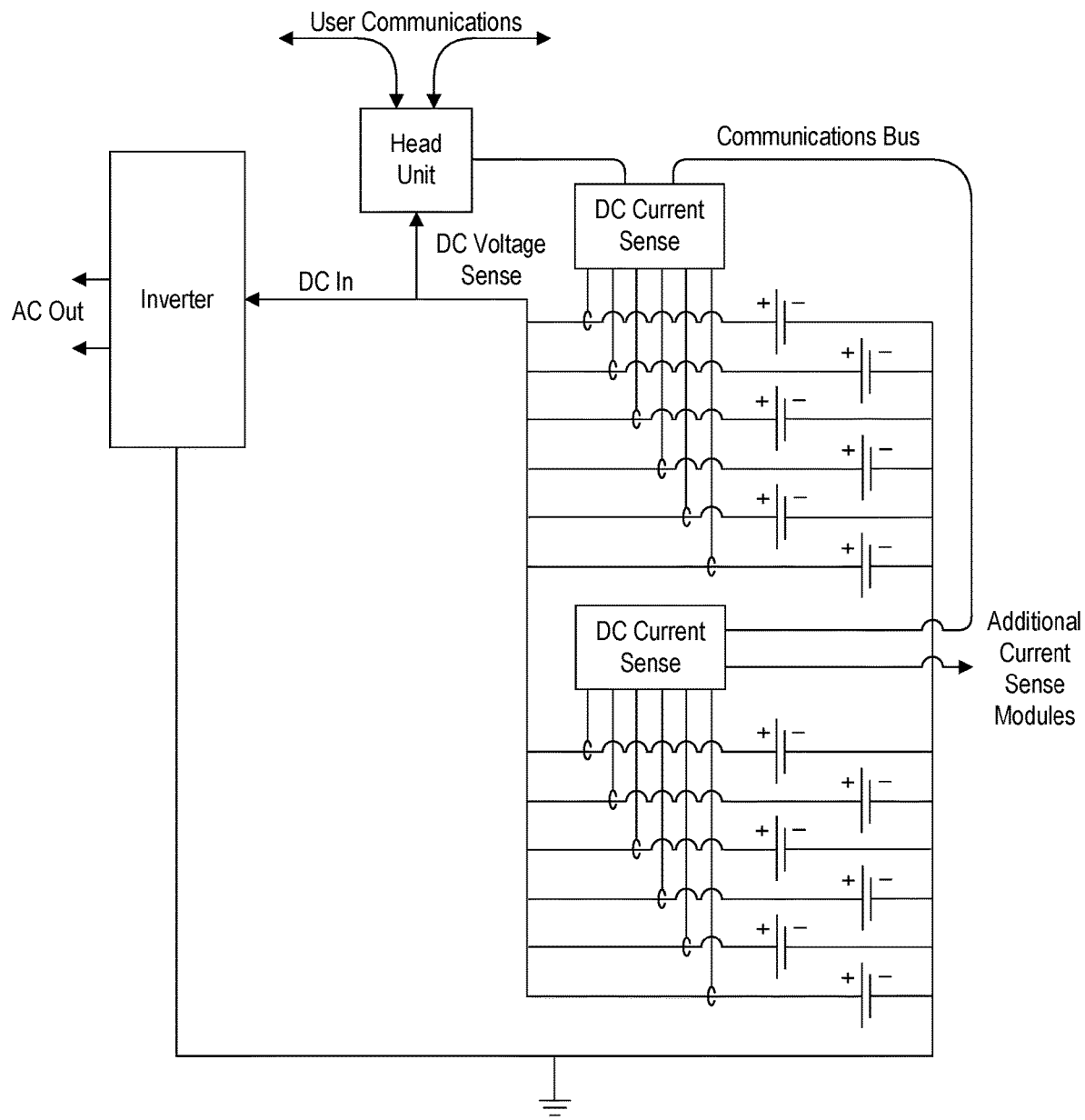
FIG. 6 illustrates a direct current distributed power monitoring system.

Referring to FIG. 6, in another embodiment a distributed direct current metering system may be used, which is suitable for current sources like batteries, solar panels, etc. The distributed direct current metering system may include time synchronization between the voltage and current sampling to include accurate energy calculation. For example, multiple branches of direct current sources may be used to feed an inverter.

To calculate energy and power in both AC and DC systems, the digitized voltage and current waveforms are multiplied together to calculate real energy for each phase, and multiple phases are combined for the energy of the multiple phases, within a circuit. Both the amplitude and time correlation of these waveforms and their samples should be accurate. Electrical real (Active) energy is typically calculated in units of watt-hours (Wh) or kilo-watt-hours (KWh).

As previously described, each single-phase circuit has both an associated voltage and an associated current. Energy meters may sample the analog voltage and analog current waveforms with analog to digital (A/D) converters to digitize the waveforms. Real (active) energy may be calculated for each single-phase circuit using the following formula: real (active) energy=$\Sigma I(t) \times V(t) \times T$, where t is time, and I(t) and V(t) are the sampled values of the current and voltage. T is the sample interval period. In an energy meter, this calculation preferably runs continuously accumulating an ever-increasing energy value. For increased accuracy for the real energy calculation, the samples of V (voltage) and I (current) should be measured at the same time t. In a distributed energy metering system, where voltage is sampled at one physical location and current is sampled at different physical location, synchronization oft across the different nodes should be performed in a manner that achieves sufficiently accurate temporal synchronization. Real energy is typically accumulated in units of Watt-Hours (Wh).

Real power is typically expressed in watts (W). Watts can be derived from watt-hours by dividing the change in the accumulated real energy by the length of the time period, namely, $$\text{Real (Active) Power} = \frac{\Delta \text{Energy}}{\Delta \text{Time}}.$$

Other calculations may be determined, such as voltage total harmonic distortion (ThdV), current total harmonic distortion (ThdI), harmonic amplitudes for voltage, and harmonic amplitudes for current. Further calculations that may be determined include, root mean square voltage (RMS) V, root mean square current (RMS) I, and apparent power VA. By way of example, the system may sense and/or determine electrical network parameters that may include, for example, voltage, current power, apparent power, ThdV, ThdI, voltage harmonic information, current harmonic information, RMS V, RMS I, apparent power VA, variations in voltages and/or currents, transient voltages and/or currents, abrupt changes, undervoltage and/or overvoltage, undercurrent and/or overcurrent, frequency variations, non-zero low frequency current and/or voltage, non-zero high frequency impedance, wave shape variations, etc.

Figure 7:
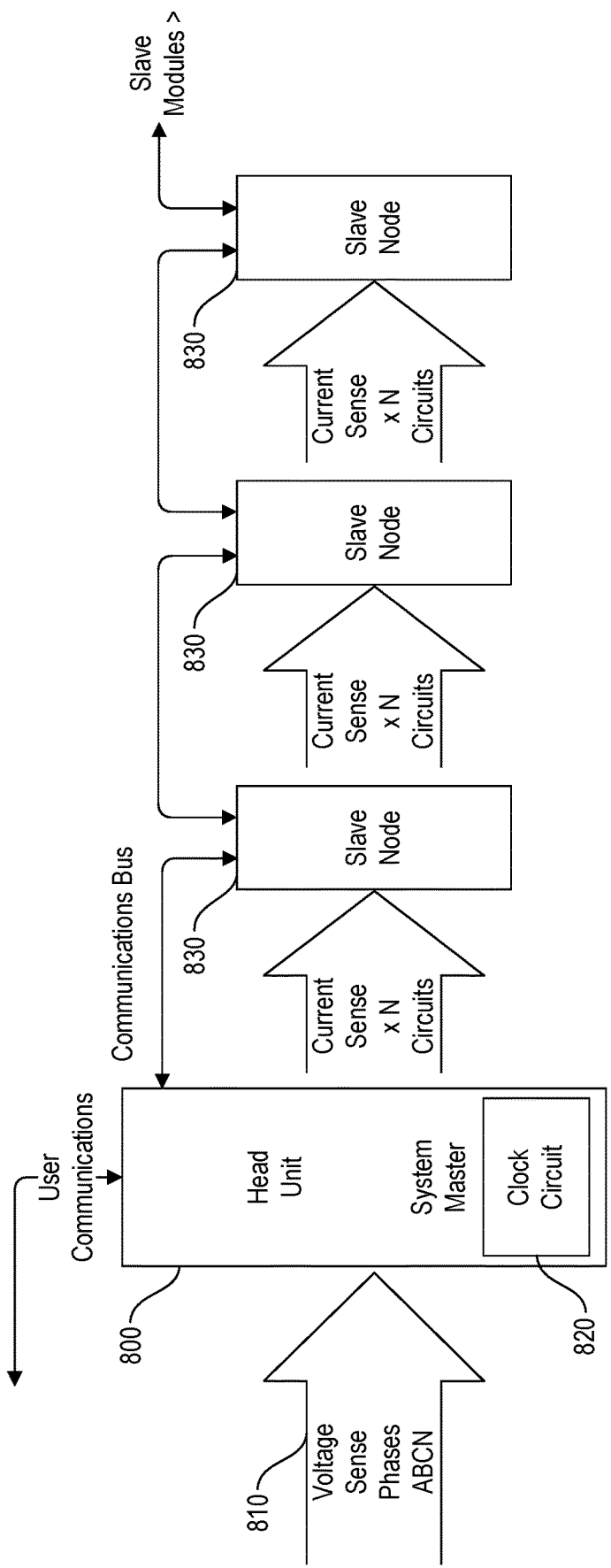
FIG. 7 illustrates a head unit and slave nodes.

Referring to FIG. 7, to provide a distributed measurement system of energy measurements, it was determined that the head unit 800 preferably samples each of the voltage waveforms 810, such as phase A, B, and C, where each of the voltage samples are time stamped. The head unit 800 may include a clock circuit 820 that may be used to provide an appropriate time stamp for each of the samples. In this manner, phase A may include a plurality of samples for each cycle (e.g., time between zero crossings). In this manner, phase B may include a plurality of samples for each cycle (e.g., time between zero crossings). In this manner, phase C may include a plurality of samples for each cycle (e.g., time between zero crossings). Phases A, B, and C may each include the same number of samples between zero crossings, although they may be different, if desired. Phases A, B, and C may each include the same temporal spacing between samples, although they may be different, if desired. Phases A, B, and C may each include the same sampling frequency, although they may be different, if desired. Phases A, B, and C may each include consistent time duration between samples, although they may be different, if desired. Accordingly, each of phase A, B, and/or C may be sampled at any suitable rate, at any suitable number of samples for each period, and at any spacing between separate samples. The head unit 800 may use a processing device, such as a field programmable gate array, an application specific integrated circuit, and/or a processor, otherwise generally referred to a computing device, to resample the discrete samples to obtain a modified representation of the underlying continuous signal. For example, the samples may be resampled to determine a set of samples, such as an integer set of samples having a number of a power of 2 (e.g., 2, 4, 8, 16, 32, 64, 128, etc.) representative of each cycle of an alternating signal. Also, as the frequency varies the resampling is preferably adjusted to maintain the integer set of samples, preferably having a number of a power of 2. The resampled set of samples may likewise include a time stamp associated with each of the resampled samples. Alternatively, the resampled set of samples may likewise include a time stamp associated with a set of resampled samples together with the frequency of the samples and/or cycle, or other manner of time stamping one or more samples. The computing device may represent the waveform as the set of resampled samples, or otherwise as a set of data representative of the waveform, such as its frequency and magnitude, together with a time stamp of its temporal occurrence. In addition, the frequency of the power line may be determined based upon a measurement circuit independent of the voltage sampling.

By way of example, the AC voltage sense node(s) may first sample the asynchronous time stamped voltage samples to calculate the line frequency, and then determine the resampling frequency and times. The resample frequency may synchronize an integer number of samples, for example 64, 128, 256, etc., with each cycle of the voltage waveform. DC meters do not need to synchronize to an AC waveform, but voltage and current samples are time aligned at a sampling frequency set by the head unit to increase accuracy. The voltage sampling node then calculates the times where it is desirable to have samples, relative to the system clock. In AC systems, such sample times are constantly recalculated to track changing line frequency and continuity with previous samples. These same times are periodically broadcast to slave nodes 830. The timing information may be transmitted in any suitable format. For example, the format may be in the form of a start time and frequency or period, or it may send the time together with each individual sample. Based upon the buffered and time stamped voltage samples, the voltage sense node calculates new samples. The voltage sense node may offset these samples in time to compensate for time based errors in its voltage sensing.

Figure 8:
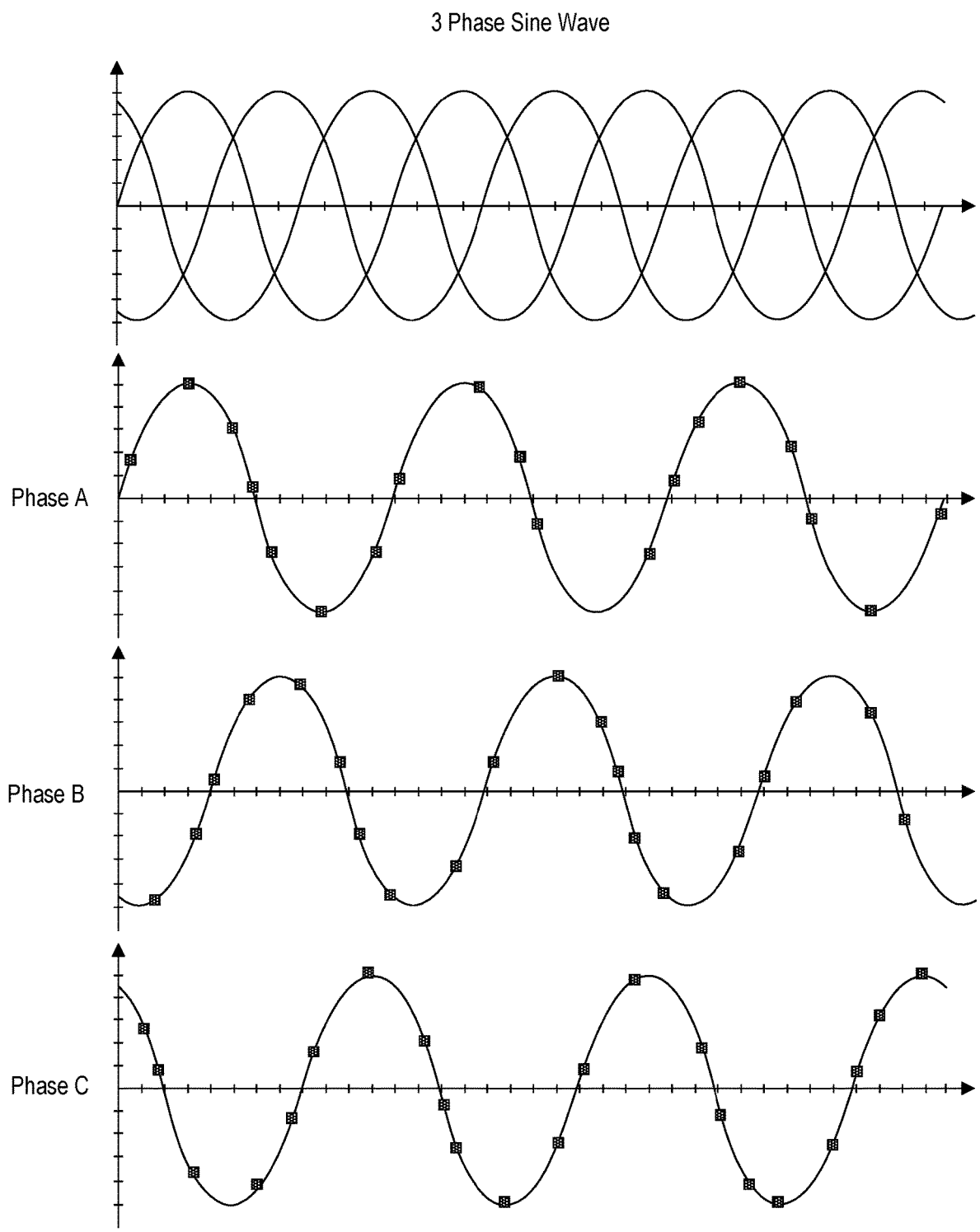
FIG. 8 illustrates three phase sine waves with asynchronous sampling.

Referring also to FIG. 8, to provide a distributed measurement system of energy measurements, it was determined that the slave node 830 (e.g., multiple circuit meter and/or current sensing strip) preferably samples each of the current waveforms, such as phases A, B, and C, together with time stamps of each of the current samples. Each of the current sensing modules may include a clock circuit that may be used to provide the appropriate time stamp for each of the respective samples, where the clock circuit is synchronized with the clock circuit 820 in the head unit 800. In this manner, phase A may include a plurality of samples for each cycle (e.g., time between zero crossings). In this manner, phase B may include a plurality of samples for each cycle (e.g., time between zero crossings). In this manner, phase C may include a plurality of samples for each cycle (e.g., time between zero crossings). Phases A, B, and C may each include the same number of samples between zero crossings, although they may be different, if desired. Phases A, B, and C may each include the same temporal spacing between samples, although they may be different, if desired. Phases A, B, and C may each include the same sampling frequency, although they may be different, if desired. Phases A, B, and C may each include consistent time duration between samples, although they may be different, if desired. Accordingly, each of phase A, B, and/or C may be sampled at any suitable rate, at any suitable number of samples for each period, and at any spacing between separate samples. The current sensing module may use a processing device, such as a field programmable gate array, an application specific integrated circuit, and/or a processor, otherwise generally referred to a computing device, to resample the discrete samples to obtain a modified representation of the underlying continuous signal. For example, the samples may be resampled to determine a set of samples, such as an integer set of samples having a number of a power of 2 (e.g., 2, 4, 8, 16, 32, 64, 128, etc.) representative of each cycle of an alternating signal. The resampled set of samples may likewise include a time stamp associated with each of the resampled samples. Alternatively, the resampled set of samples may likewise include a time stamp associated with a set of resampled samples together with the frequency of the samples and/or cycle, or other manner of time stamping one or more samples. The computing device may represent the waveform as the set of resampled samples, or otherwise as a set of data representative of the waveform, such as its frequency and magnitude, together with a time stamp of its temporal occurrence.

Any suitable manner may be used to achieve the resampling of the sampled waveforms. For example, a linear interpolation technique may be used where two samples are selected that bracket the point in time for which a sample is desired. A straight line calculations may be determined between the two samples, and the value of the straight line at the point of time is determined. For example, a Hermite spline may be used which takes into account the past and future of the waveform when calculating a sample at a new point in time.

The remote slave nodes receive the samples and time stamps from the voltage sampling node, for which the slave node may use to resample the current samples. The timing is relative to the shared system clock. The slave node from its buffered and time stamped samples calculates new samples for the same points in time as the voltage sensing node. The current sensing node may intentionally offset such samples in time to compensate for known errors in its current sensing.

To provide distributed metering, especially suitable for system with a significant number of circuits all of which are operating based on the same voltage source(s), a digitization of some of the currents and/or voltages is desirable. In this manner, the currents and/or voltages may be sensed at different locations. The conversion of analog signals, such as those sensed by the sensors, to digital signals is preferably performed at a physical location that is close to the location that the analog signals are sensed and to reduce losses and modifications in the analog signals as a result of significant transmission distances. With the voltages being measured for one or more current metering modules at a single location simplifies installation and safety issues related to installation of the voltage measurement. Preferably, a single voltage set of measurements is made for a particular system.

With the currents being measured for one or more of the current sensing modules, each of which are preferably sensing different currents, the conversion of analog signals, such as those sensed by the sensors, to digital signals is preferably performed at a physical location that is close to the location that the analog signals are sensed and to reduce losses and modifications in the analog signals as a result of significant transmission distances. With the currents being measured for one or more current metering modules at a single location simplifies installation and safety issues related to installation of the current measurements. Preferably, a plurality of current sensing modules are included within a particular system.

The head unit and each of the current sensing modules are preferably interconnected together with a wired network based communication interconnection, such as an Ethernet interconnection and/or a RS-485 interconnection. Alternatively, the head unit and each of the current sensing modules may be interconnected together with a wireless network based communication interconnection, such as IEEE 802.15.4 Zigbee and/or IEEE 802.11WiFi Standard(s). Alternatively, the head unit and each of the current sensing modules may be interconnected together with a combinations of wireless network based communication interconnection(s) and wired interconnection(s). For example, for the head unit to send 32 bit samples at a rate of 256 samples per cycle of a 60 Hertz AC waveform for three voltage phases may require generally about 1.5 MB/s bandwidth. For example, if Ethernet cables are used, then Ethernet switches may be included with each node to allow data frames to pass through with minimal delay over chained Ethernet cables. Bussed interfaces, such as RS-485, may be used, with slave nodes all listening to the bus. For example, voltage samples and timing information may be broadcast to the current sampling slave nodes from the bus master. On request, the slave nodes may send back the results of their metering calculations, captured waveforms, or any other data that is requested.

To limit the amount of bandwidth required for effective communication, preferably the head unit transmits the resampled voltage measurements to each of the respective current sensing modules. Also, the head unit may transmit the resampled voltage measurements to one or more of the respective current sensing modules, which in turn transmit the resampled voltage measurements to other respective current sensing modules.

Each of the current sensing modules may using a local computing device to calculate electrical parameters, such as real power, based upon the locally resampled sensed current measurements and based upon the non-locally resampled sensed voltage measurements received from the head unit, together with time stamp information for the current(s) and time stamp information for the voltage(s) for synchronization. In this manner, each of the current sensing modules performs the calculations for the electrical parameters local to its current sensors, together with voltage data received from a non-local device over a wireless and/or wired interconnection.

Figure 9:
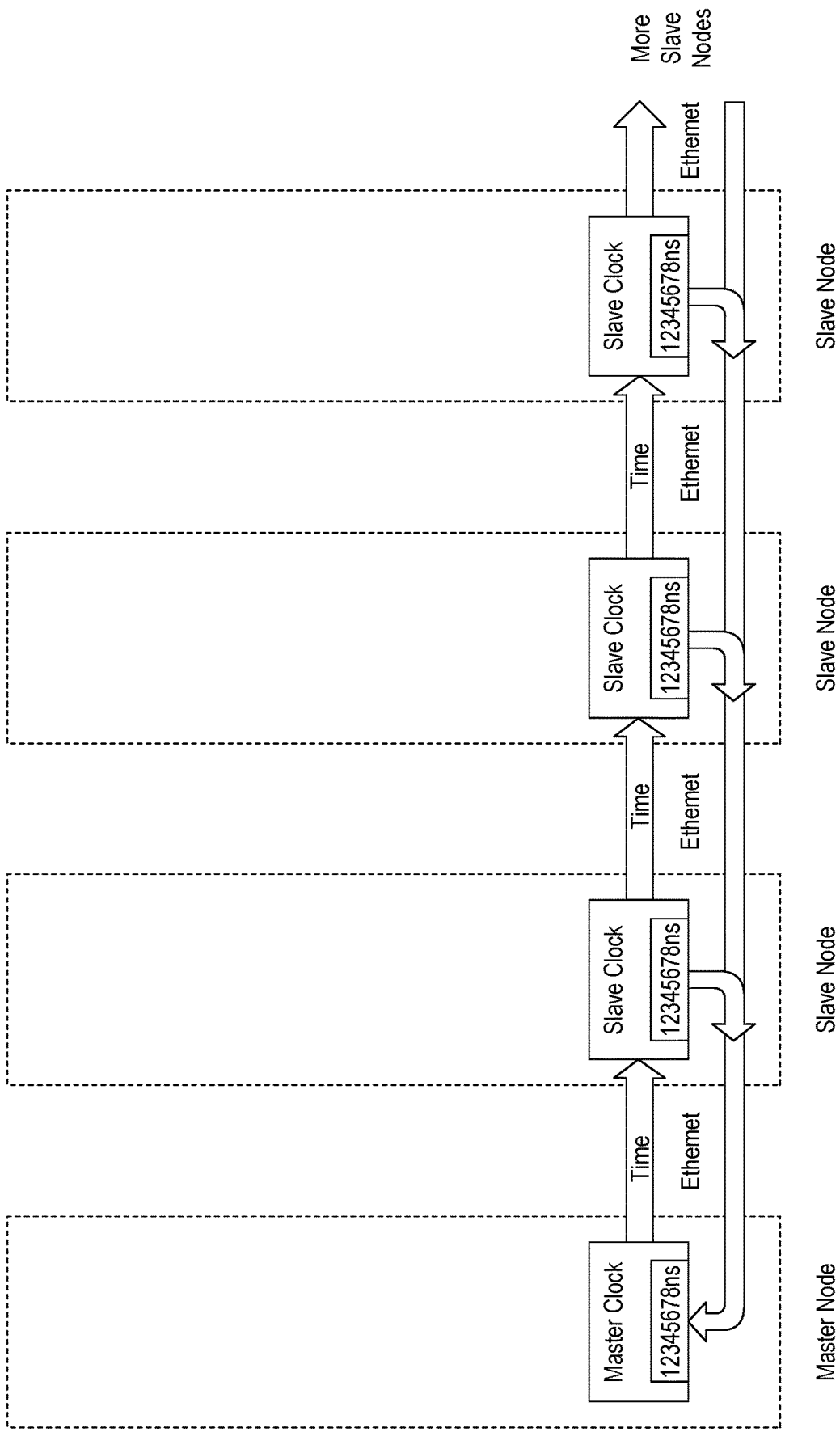
FIG. 9 illustrates a master node with a master clock and slave nodes with slave clocks.

Referring to FIG. 9, one node in the system, preferably the head unit (e.g., master node) although other unit(s) may be used, acts as the clock master for the distributed power monitoring system. Slave nodes other than the one that includes the master clock, may include a clock that is embodied in software, firmware, and/or circuitry, either in software and/or hardware that is synchronized, e.g., slaved, to the master clock. The master clock may be synchronized to an external clock source, such as the power grid, global positioning system (GPS), or otherwise. Any of the clock circuits may be synchronized to such external clock source. The clock circuits in each node may be synchronized using one or more existing industrial ethernet protocols, such as EtherCAT, Ethernet PTP, IEEE 1588, SERCOS (serial real-time communication system), Modbus IP, BACnet TCP, SNMP, etc. Such techniques may include bi-directional communications to determine the time delay of each node relative to the master clock node, and to compensate for this delay when setting their clocks. Accuracy may be on the order of 10's of nano-seconds.

Figure 10:
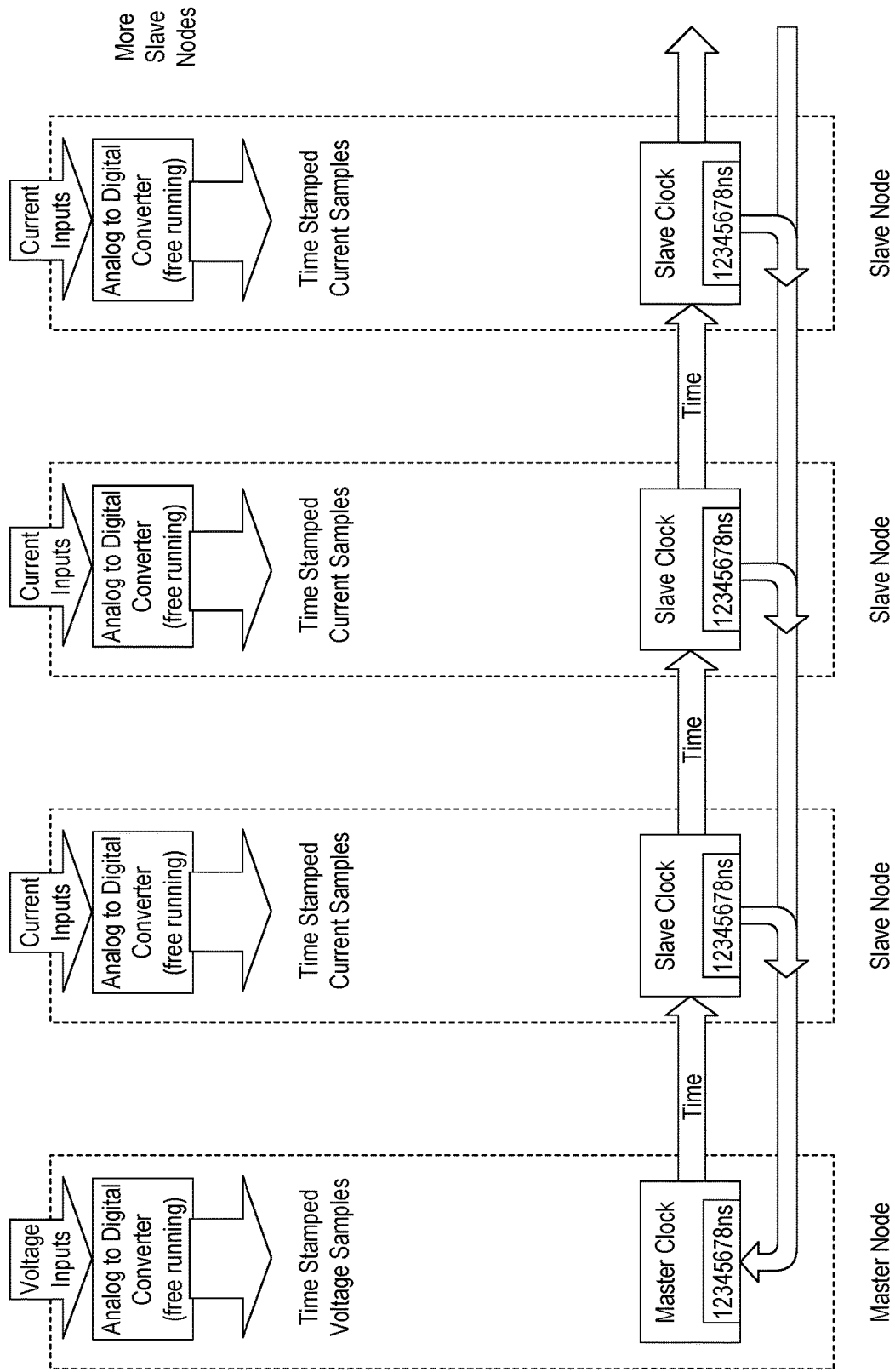
FIG. 10 illustrates a master node with time stamped sampling and slave nodes with time stamped sampling.

Referring to FIG. 10, the analog to digital converter within each of the respective head unit and multiple circuit meter and/or current sensing strip operates in an asynchronous manner relative to the other nodes and do not share a common clock. Each of the analog to digital converters may operate at a different sampling rate, and is asynchronous to both the waveform being sampled and to the analog to digital converters in nodes. For example, the sampling frequency may vary substantially between different nodes. The samples are time stamped using the clock time shared between the other nodes, either individually or in groups. The point in time relative to the system clock is known for every sample for every node. The samples together with their time stamps may be stored in a memory at the respective node until subsequently needed. As previously described, FIG. 8 illustrates an example of asynchronous sampling of AC voltage and current waveforms having different sampling frequencies and temporal alignment. In the event that multiple voltage references are included within the distributed power monitoring system, multiple voltage references may be sampled at one or more nodes.

Figure 11:
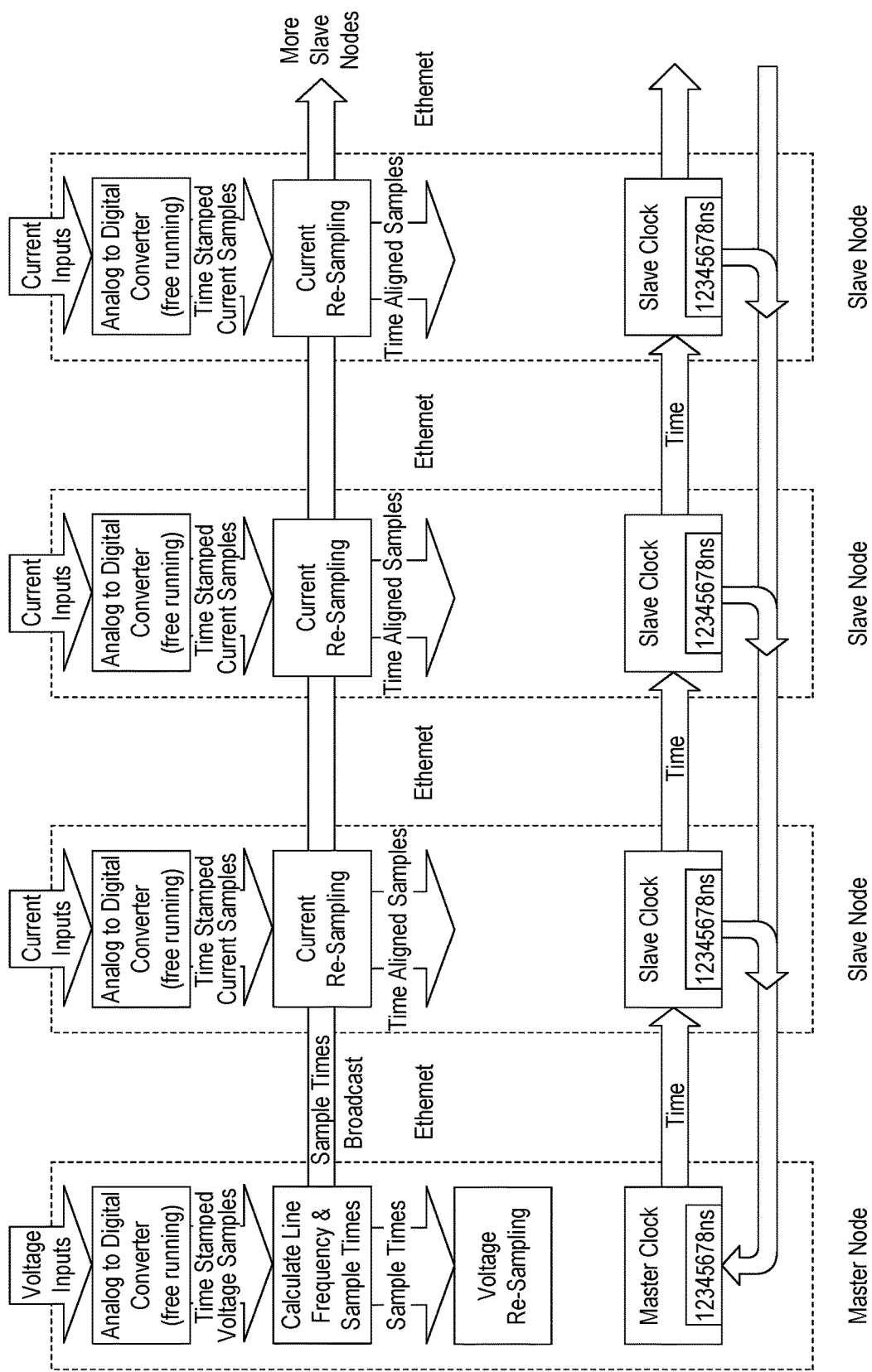
FIG. 11 illustrates a master node with sample re-sampling and slave nodes with sample re-sampling.

Referring to FIG. 11, as previously described, it is desirable to have the voltage and current samples time aligned with one another for calculation purposes. Each of the nodes calculates respective new time synchronous voltage and current samples from the stream of asynchronous time stamped samples determined by the respective analog to digital converters for any point in time. The point in time relative to the common clock that such re-sampling are calculated is preferably determined by a master clock in a master node (such as the head unit).

Figure 12:
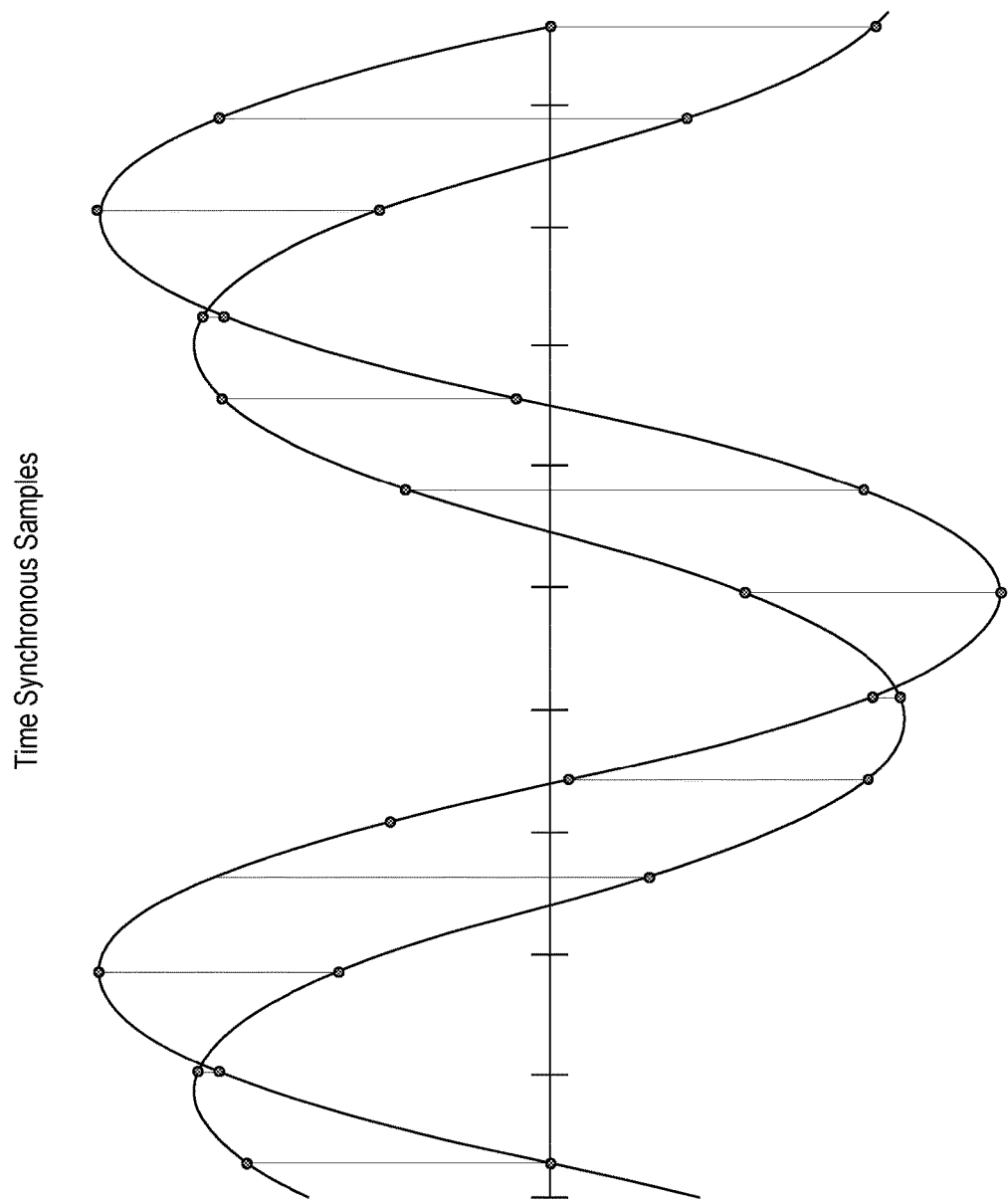
FIG. 12 illustrates two phase sine waves with synchronous sampling.

Referring to FIG. 12, as previously described, it is desirable to resample the current and voltage waveforms so that the samples are time aligned with the same resampling frequencies. Various calculations, such as real energy, may be determined by multiplying the resampled current and voltage waveforms together. Preferably there are an integer number of samples time aligned with the voltage and current waveforms to reduce errors in the total harmonic distortion (Thd) and harmonic amplitude calculations as a result of tail errors.

Figure 13:
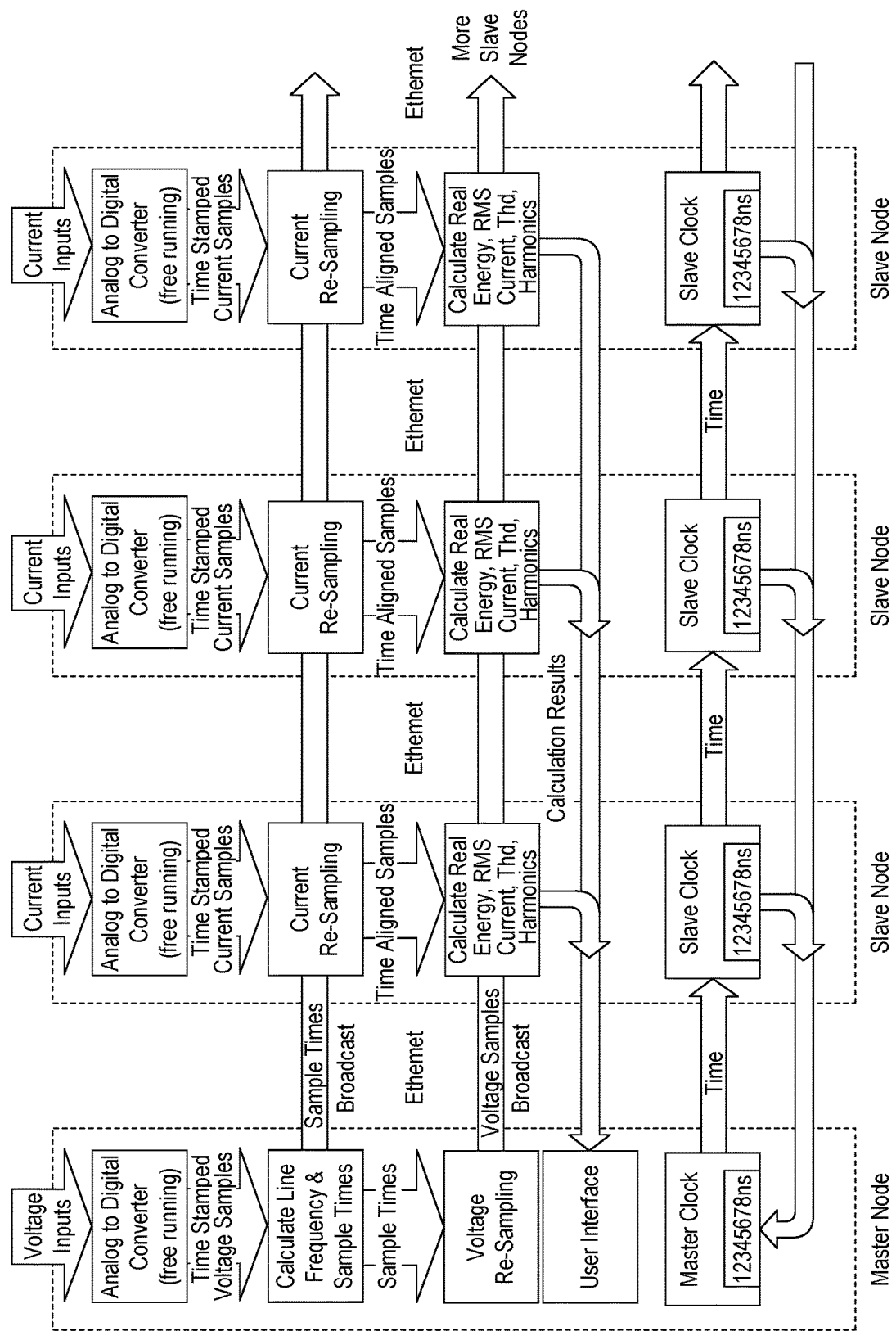
FIG. 13 illustrates a master node with sample re-sampling and slave nodes with sample re-sampling together with energy calculations.

Referring to FIG. 13, the voltage sampling nodes may broadcast a stream of voltage samples, generated as a result of resampling, to all of the slave nodes. Such transmissions may include the sample time information previously described. Each of the current sense channels may be considered with an associated voltage stream. If more than one voltage sampling node is present, the slave node may also be configured to use the voltage sample stream associated with the currents it is measuring. The resampled voltage samples are received by the slave node's metering calculation processor, along with the locally generated current resamples that are synchronized on the same time alignment and with the waveform being measured. It is noted that the analog to digital converters are preferably 'free running' at any suitable rate with subsequent resampling, as previously described. The slave node may perform the metering calculations, such as real energy, total harmonic distortion, harmonic distortion, etc.

It may be observed that there is preferably sufficient processing capabilities for the energy calculations for a set of current transducers included with the current module, such as previously discussed. With the inclusion of additional current modules, each of which includes preferably sufficient processing capabilities for the energy calculations of its respective current transducers, the overall energy measuring system is readily dynamically scalable.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A method of measuring electrical network parameters, comprising:
    (a) providing a shared system clock with a synchronized operation of a first clock of a voltage sensing node having a first buffer and a second clock of at least one current sensing node having a second buffer of an electrical network, wherein said current sensing node is remote from said voltage sensing node;
    (b) sampling at least one voltage signal from a voltage transducer at said voltage sensing node of said electrical network into said first buffer as time stamped digitized voltages using a voltage time stamped based on said first clock;
    (c) sampling a plurality of current signals from a plurality of respective current transducers at said at least one current sensing node of said electrical network into said second buffer as time stamped digitized currents using a current time stamp based on said second clock and associated with said at least one current sensing node of said electrical network, wherein said sampling of at least one of said plurality of current signals is at a first sampling frequency, wherein said sampling of said at least one voltage signal is at a second sampling frequency, wherein said first sampling frequency is different than said second sampling frequency;
    (d) re-sampling said sampled at least one voltage signal, including calculating new samples from the buffered time stamped digitized voltages, to determine a representation of the at least one re-sampled voltage signal with a re-sampling frequency;
    (e) communicating said representation of the at least one re-sampled voltage signal to said at least one current sensing node through a communication link;
    (f) re-sampling each of said sampled plurality of current signal, including calculating new samples from the buffered time stamped digitized currents, to determine a representation of the plurality of re-sampled current signals with said re-sampling frequency; and
    (g) calculating said electrical network parameters at said at least one current sensing node based upon said at least one re-sampled voltage signal and a respective said re-sampled current signal of said plurality of re-sampled current signals using a temporal alignment with said re-sampling frequency and of said representations where said temporal alignment is based upon said voltage time stamp and said current time stamp.

2. The method of claim 1 wherein said temporal alignment is achieved by synchronizing said first clock and said second clock based upon GPS.

3. The method of claim 1 wherein said voltage sensing node includes said first clock circuit and said at least one current sensing node includes said second clock circuit.

4. The method of claim 1 further comprising said communicating said at least one re-sampled voltage signal to said at least one current sensing node through said communication link where when said re-sampling of said sampled at least one voltage signal is performed at said at least one voltage sensing node.

5. The method of claim 1 further comprising determining a power line frequency of said sampled at least one voltage signal, based upon either said sampling of at least one voltage signal or by a measurement circuit separate from said sampling said at least one voltage signal.

6. The method of claim 1 wherein said at least one re-sampled voltage signal and/or said at least one re-sampled current signal include(s) an integer number of samples within a cycle based upon said power line frequency.

7. The method of claim 1 further comprising determining said re-sampling frequency based upon a power line frequency.

8. The method of claim 1 wherein the sampling frequency of said at least one of said plurality of current signals is asynchronous with respect to the sampling frequency of said at least one voltage signal.

9. A system for measuring electrical network parameters, comprising:
    (a) at least one voltage sensing node of an electrical network including a first clock and a first buffer;
    (b) at least one current sensing node of said electrical network including a second clock and a second buffer;
    (c) a shared system clock with a synchronized operation of said first clock with said second clock in a synchronized manner;
    (d) said at least one voltage sensing node of said electrical network sampling at least one voltage signal from a voltage transducer into said first buffer as time stamped digitized voltage using a voltage time stamp based on said first clock;
    (e) said at least one current sensing node of said electrical network sampling a plurality of current signals from a plurality of respective current transducers into said second buffer as time stamped digitized current using a current time stamp based on said second clock associated with said at least one current sensing node of said electrical network, wherein said sampling of at least one of said plurality of current signals is at a first sampling frequency, wherein said sampling of said at least one voltage signal is at a second sampling frequency, wherein said first sampling frequency is different than said second sampling frequency;
    (f) said at least one voltage sensing node re-sampling said sampled at least one voltage signal to determine a representation of the at least one re-sampled voltage signal with a re-sampling frequency;
    (g) said at least one voltage sensing node communicating said representation of the at least one re-sampled voltage signal to said at least one current sensing node through a communication link;
    (h) said at least one current sensing node re-sampling each of said sampled plurality of current signals, including calculating new samples from the buffered time stamped digitalized currents, to determine a representation of the plurality of current signals with said re-sampling frequency; and (i) said system calculating said electrical network parameters at said at least one current sensing node based upon said at least one re-sampled voltage signal and a respective said re-sampled current signal of said plurality of re-sampled current signals using a temporal alignment with said re-sampling frequency and of said representations, where said temporal alignment is based upon said voltage time stamp and said current time stamp.

* * * * *

UNITED STATES PATENT AND TRADEMARK OFFICE
CERTIFICATE OF CORRECTION

| | | |
|---|---|---|
| PATENT NO. | : 11,360,130 B2 | |
| APPLICATION NO. | : 16/447751 | |
| DATED | : June 14, 2022 | |
| INVENTOR(S) | : Aaron Parker, Piotr Przydatek and Eric Moon | |

It is certified that error appears in the above-identified patent and that said Letters Patent is hereby corrected as shown below:

In the Specification

Column 6, Line 6: Replace "examples" with --example--

Column 8, Line 19: Replace "oft" with --of t--

Column 11, Line 47: Replace "using" with --use--

Signed and Sealed this
Twenty-sixth Day of March, 2024

*Katherine Kelly Vidal*

Katherine Kelly Vidal
*Director of the United States Patent and Trademark Office*